United States Patent [19]

Minami et al.

[11] Patent Number: 4,507,647
[45] Date of Patent: Mar. 26, 1985

[54] ENCODER

[75] Inventors: Masana Minami, Kawasaki; Hiroshi Tamaki, Tokyo; Tsuneo Sasaki, Tokyo; Kazuaki Kimura, Tokyo, all of Japan

[73] Assignee: Tokyo Kagaku Kikai K.K., Tokyo, Japan

[21] Appl. No.: 256,928

[22] Filed: Apr. 23, 1981

[30] Foreign Application Priority Data

Apr. 30, 1980 [JP] Japan ................... 55-57281

[51] Int. Cl.³ ............... H03K 13/18; G01D 5/34
[52] U.S. Cl. ............... 340/347 P; 250/231 SE; 250/237 G
[58] Field of Search ............... 250/237 G, 231 SE; 340/347 M, 347 P; 33/125 C; 356/373–375, 383–387

[56] References Cited

U.S. PATENT DOCUMENTS

| | | | |
|---|---|---|---|
| 2,656,106 | 10/1953 | Stabler | 340/347 M X |
| 3,096,441 | 7/1963 | Burkhardt | 250/231 R X |
| 3,330,964 | 7/1967 | Hobrough et al. | 250/231 R X |
| 3,578,980 | 5/1971 | Decker et al. | 250/237 G |
| 3,591,841 | 7/1971 | Heitmann et al. | 250/237 G X |
| 3,599,004 | 8/1971 | Grendelmeier | 250/237 G X |

Primary Examiner—T. J. Sloyan
Attorney, Agent, or Firm—Oblon, Fisher, Spivak, McClelland & Maier

[57] ABSTRACT

An encoder having an optical measuring part establishing a vernier relationship between a code plate and a line sensor, and counters for obtaining a course reading from time serial output signals of the line sensor and a fine reading from the vernier relationship. Correction data including a change component in a magnification of a lens system are obtained from a counter. The correction data and the fine reading are supplied to a converting circuit to provide a corrected fine reading.

5 Claims, 18 Drawing Figures

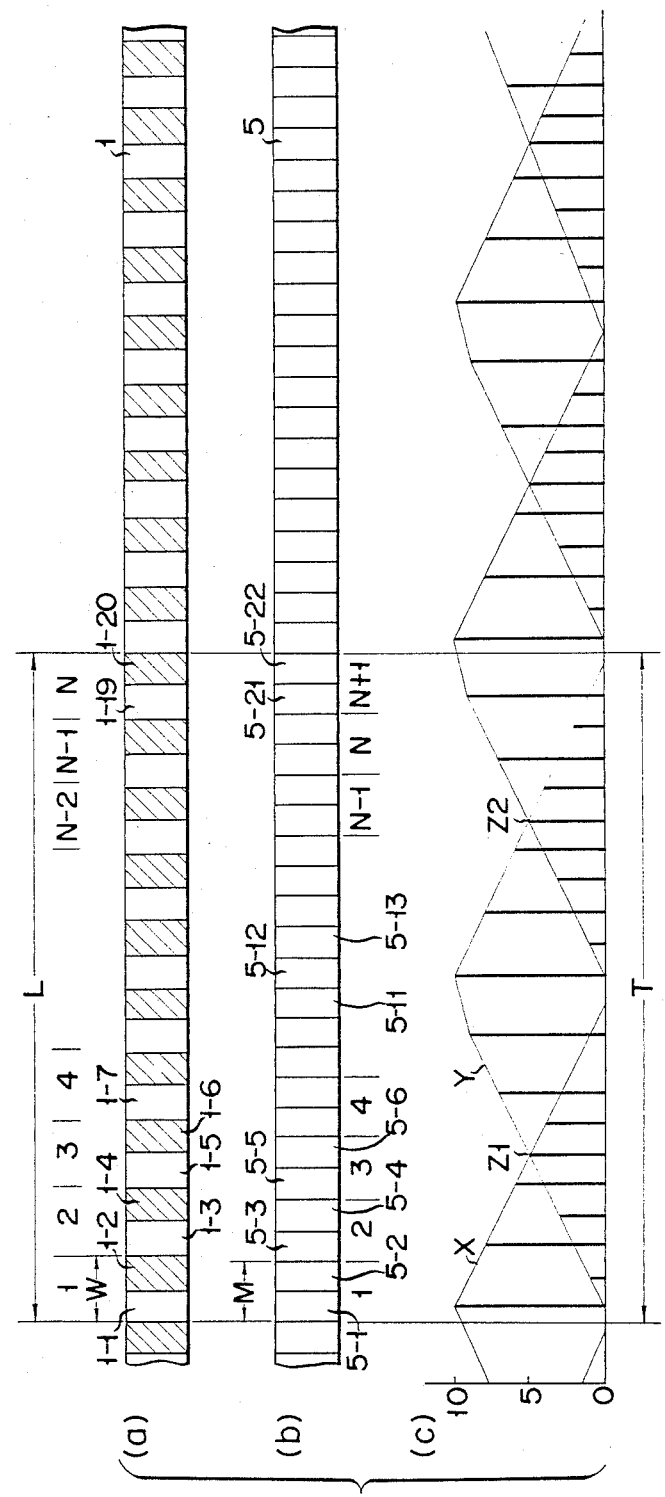

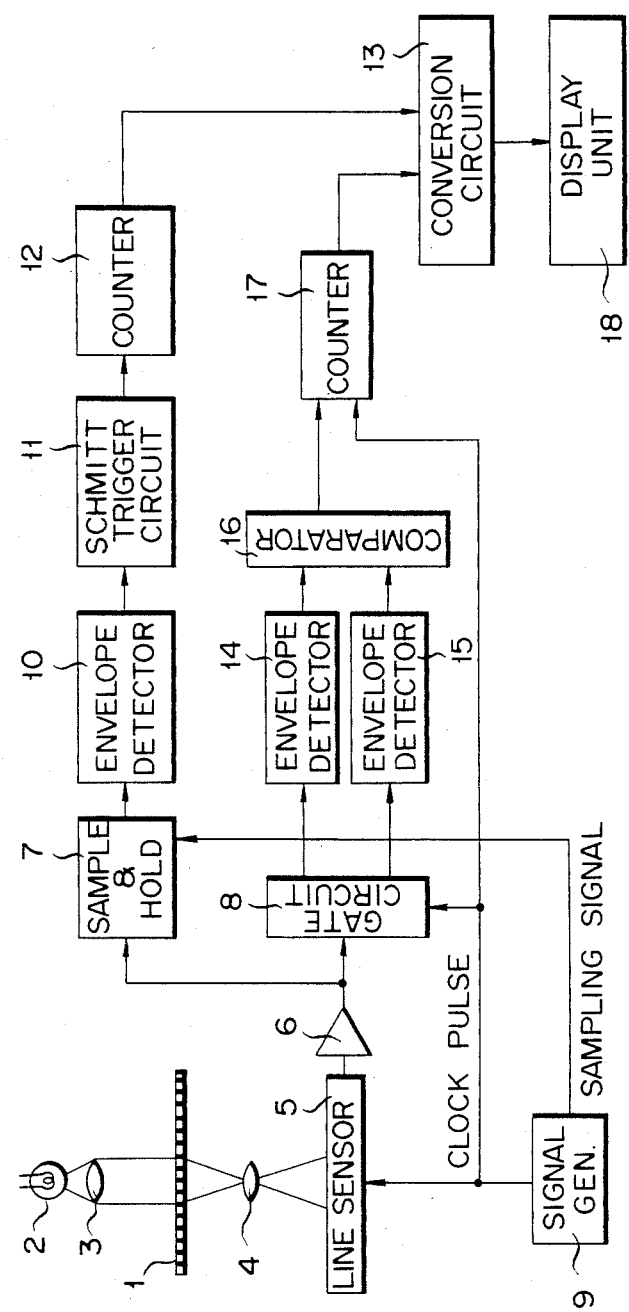

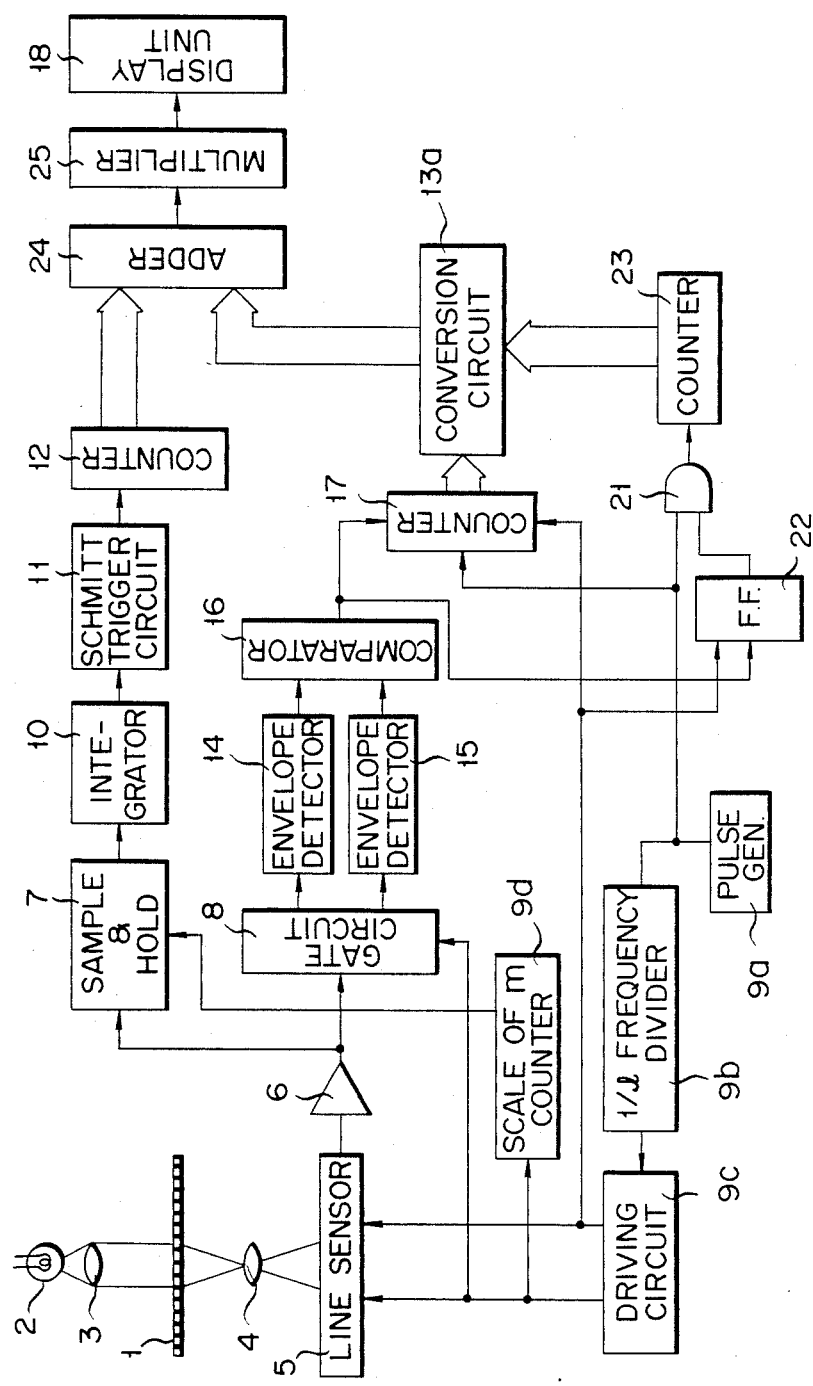

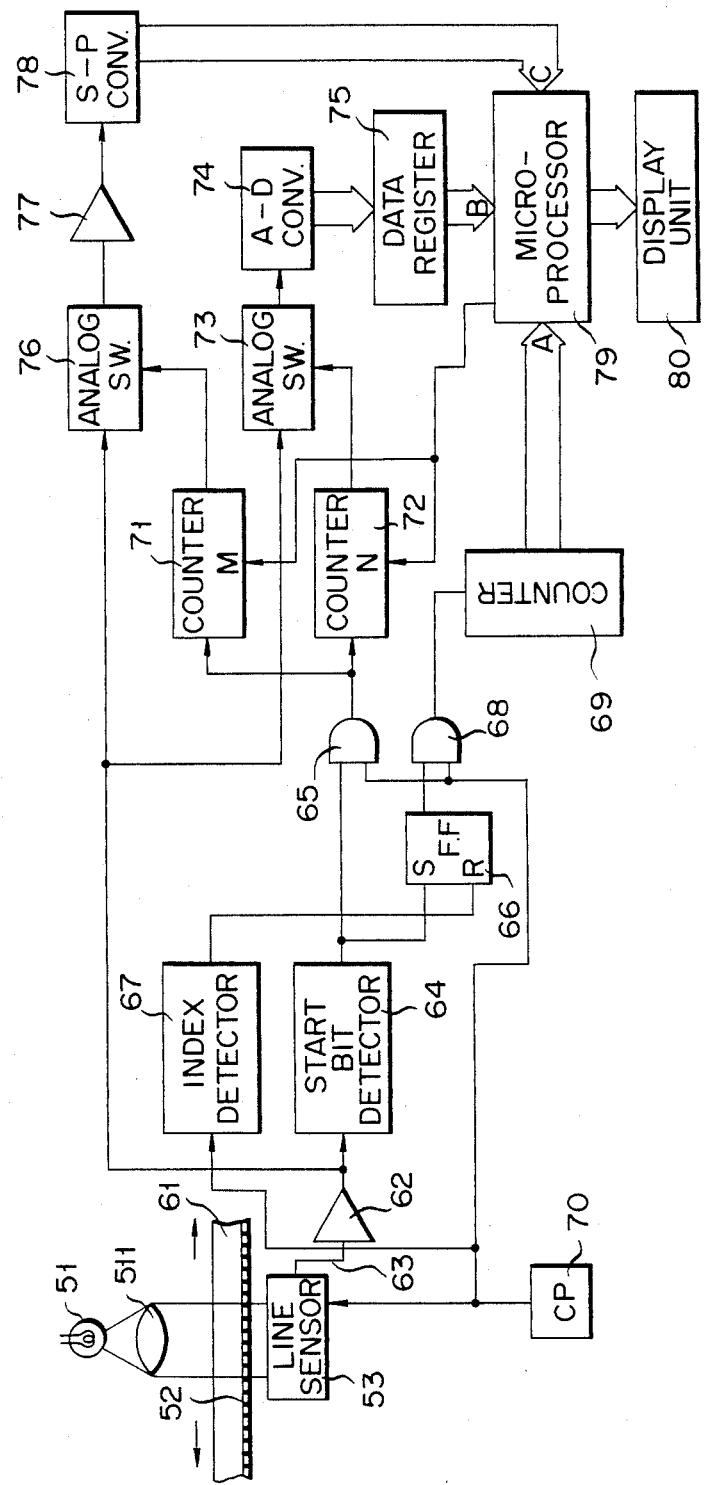
F I G. 12

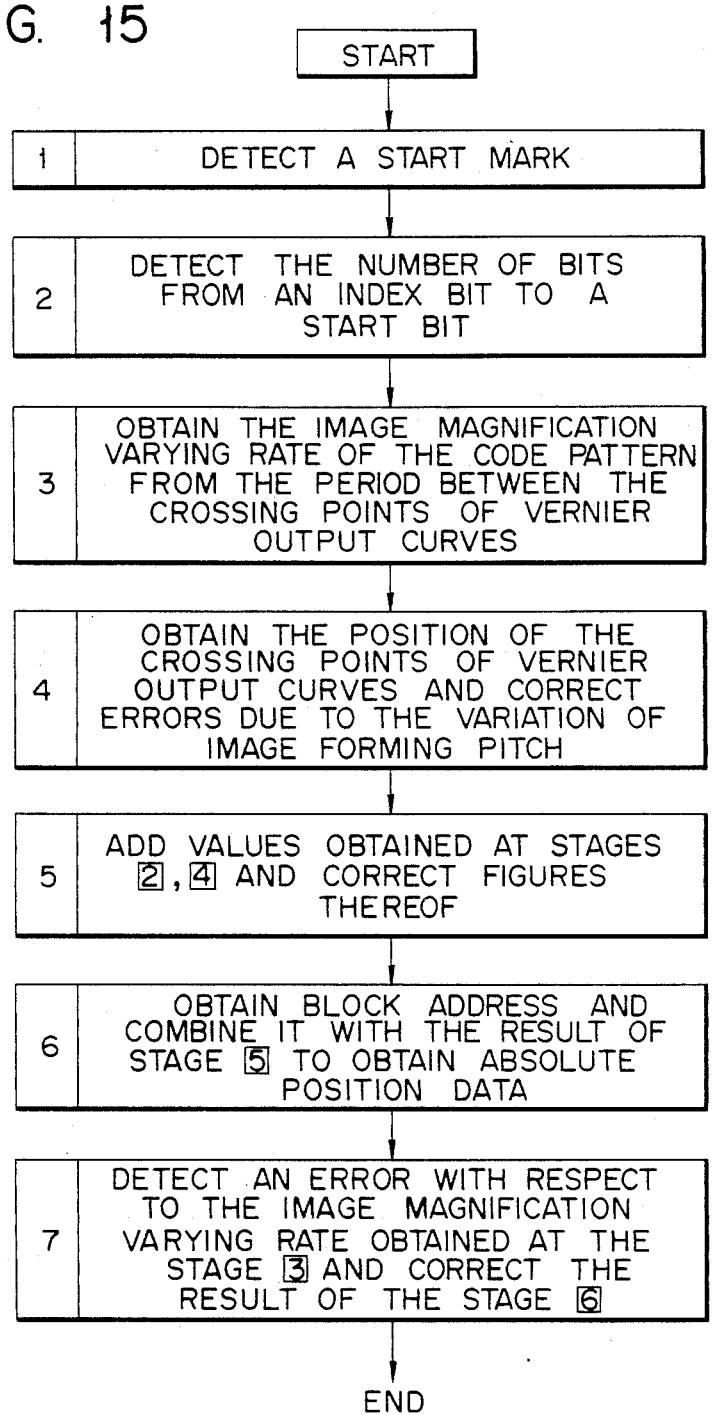

ns text

ENCODER

BACKGROUND OF THE INVENTION

1. Field of the Invention

The present invention relates to an encoder wherein a vernier relationship is held between a code plate with alternating transparent and nontransparent parts and a sensor array for converting light transmitted through this code plate into electric signals.

2. Description of the Prior Art

An encoder has been developed which is designed to have a vernier relationship between a code plate with alternating transparent and nontransparent lattice parts and a sensor array for converting the light transmitted through the code plate into electric signals by arranging n lattice parts and (n+1) sensor elements within one block. By realizing the vernier relationship between the code plate and the sensor array, the effective precision of measurement of the distance of the relative displacement may be improved to $1/(n+1)$ of the lattice width of the code plate.

This vernier relationship can also be performed by determining the sum of the widths of the transparent and nontransparent lattice parts as a minimum unit and by determining the width of two sensor elements as a minimum detecting unit.

A case will be described wherein such a measuring principle is applied to an linear scale encoder reference to the accompanying drawings. FIG. 1 shows the schematic construction of such an encoder wherein a code plate 1 has a lattice pattern in which the transparent and nontransparent parts are alternately arranged. Light emitted from a lamp 2 is irradiated on this code plate 1 after being refracted into parallel light rays by a lens 3. The light which has passed through the code plate 1 forms an image representing the lattice pattern on a line sensor 5 through an objective lens 4. The line sensor 5 comprises, for example, a plurality of photocells which are arranged parallel to the code plate 1 and which output electric signals of an amplitude corresponding to the intensity of light incident on the respective photocells as time serial signals.

The code plate 1 and the line sensor 5 are used, for example, as an encoder for measuring the relative displacement of a cutting tool and a workpiece mounted on a tool slide and as parts slide of an NC machine. FIG. 2 shows on an enlarged scale the relative positions of the code plate 1 and the line sensor 5 at a certain moment. In FIG. 2(a), a transparent part 1-1 and a nontransparent part 1-2 of the code plate 1 have the same width, and the total width of the two parts 1-1 and 1-2 will be designated as period W. This period W is the minimum unit of the lattice pattern. A total of N units are included in a length L, defining one block. The line sensor 5, as shown in FIG. 2(b), comprises 2(N+1) photocells in the block of length L. The total period M of two photocells is slightly smaller than the minimum unit period W of the lattice pattern. In FIG. 2, N=10, so 22 photocells are used. This period M will be designated to be the minimum unit of the sensor array. A total of N+1 units is included in the length L defining one block.

FIG. 2(c) shows the outputs of the respective photocells in this conditions when the parallel light rays are incident on the code plate 1 from above. For example, in a photocell 5-1, since the light is incident on its entire photosensitive area through the transparent part 1-1, its output level becomes 10. At the adjacent photocell 5-2, since most of the light is blocked by the nontransparent part 1-2, the output level is substantially 0. Half of the photosensitive area of a photocell 5-6 is not irradiated with light due to a nontransparent part 1-6, so its output level becomes 5. An envelope X of the outputs of the photocells of odd numbers within one block, 5-1, 5-3, . . . 5-21, is a triangular waveform of period T which reaches a maximum at the photocell 5-1 and reaches a miminum at the photocell 5-11. An envelope Y of the outputs of photocells of even numbers, 5-2, 5-4, . . . 5-22, is a triangular waveform of period T which reaches a minimum at the photocell 5-22 and reaches a maximum at the photocell 5-12. The envelopes X and Y have two intersections (Z1, Z2) within the period T. Referring to FIG. 2, when the code plate 1 and the line sensor 5 are transversely displaced relative to each other, the output change repeats with a pattern period W of one cycle. This indicates that the relative displacement W between the code plate 1 and the line sensor 5 is translated, in an enlarged scale, into an output change of the 22 photocells 5-1 to 5-22.

FIG. 3 shows the manner in which the intersections Z1 and Z2 of the output envelopes X and Y of the line sensor photocells of odd and even numbers are displaced on the line sensor 5 according to the relative displacement of the code plate 1 and the sensor 5. The unit displacement S0 is represented as $$S0 = W/2(N+1) = W/22$$

Accordingly, the displacement of the intersections Z1 and Z2, that is, the relative displacement S of the code plate 1 and the line sensor 5, may be represented as $$S = mS0 (m = 1, 2, \ldots 22)$$

Therefore, by detecting the position of the intersection Z1 or Z2 on the line sensor 5, the pattern period W may be interpolated with a precision of $\frac{1}{2}(N+1)$.

In order to detect the intersections Z1 and Z2 of the envelopes of the outputs of the photocells of odd and even numbers, the outputs of the respective photocells are separated into two signal sequences and are passed to two envelope detectors. The output levels of these two envelope detectors are compared to determine the point at which both outputs are at the same level. Since the intersections Z1 and Z2 move the same distance for a single relative displacement of the code plate 1 and the line sensor 5, only one of them need be detected for a period T. For example, referring to FIG. 2(c), the range within which the envelope X is larger than the envelope Y(X>Y) is defined as the positive phase, the range within which X<Y is defined as the negative phase, and only the intersection Z1 making the transition from the positive to the negative phase needs to be considered. This intersection Z1 is counted by clock pulses synchronous with the scanning operations of the line sensor 5 starting from an arbitrary photocell. It is apparent that this counted value represents the displacement S of the code plate 1 relative to the line sensor 5 as mS0{m: 1,2 . . . 2(N+1)} within the range of W.

As the encoder, in addition to the interpolation described above, readout of upper significant digits, that is, at the minimum unit of half (W/2) of the period W of the code plate 1 is also necessary. Now the output of a particular photocell of the line sensor 5 is considered. When the line sensor 5 relatively moves with respect to the code plate 1, the output of this particular photocell at each scanning becomes the sinusoidal waveform having the lattice pattern period W as the period. This output of the particular photocell is sampled and held and converted into a pulse signal with a duty cycle of 50%. By counting the leading and trailing edges of this pulse signal, coarse reading of the minimum unit of W/2 may be accomplished.

An encoder for reading the relative displacement of the code plate 1 and the line sensor 5 may be obtained by combining the coarse reading of the W/2 unit and the fine reading obtained by the interpolation of the W/2(N+1) unit described above.

FIG. 4 shows an example of the circuit configuration of an encoder realizing the operation principle described above. The code plate 1 and the line sensor 5 shown in FIG. 4 are in the relative positions shown in FIG. 5. The light emitted from the lamp 2 shown in FIG. 4 is refracted into uniform parallel light rays by the lens 3. The light rays are then irradiated on the code plate 1. The pattern of the code plate 1 is formed as an image on the line sensor 5 by the lens 4. As a result, the waveform of the time serial output signal obtained from the line sensor 5 becomes as shown in FIG. 6(a).

The time serial output signal as shown in FIG. 6(a) obtained from the line sensor 5 is amplified to a predetermined level by an amplifier 6 and is thereafter supplied to a sampling and holding circuit 7 and to a signal distributor 8. For the coarse reading of the W/2 minimum unit, the output of the sampling and holding circuit 7 is used. The sampling and holding circuit 7, in response to a sampling signal generated by a drive circuit, that is, a signal generating circuit 9, samples and holds the output of a particular photocell in the line sensor 5 once for energy scanning operation of the line sensor 5. The envelope of the output of this particular photocell which is held is detected by an envelope detector 10. The detector 10 outputs a sinusoidal wave having the period W of the sensor array as a period thereof. The sinusoidal output of the envelope detector 10 is supplied to a Schmitt trigger circuit 11 to be converted into a square wave at a suitable slice level, for example, 50% level. The leading and trailing edges of the output of the Schmitt trigger circuit 11 are counted by a counter 12, and a signal representing the coarse reading counted value is supplied to a converting circuit 13.

The time serial signal shown in FIG. 6(a) supplied to the signal distributor 8 are used for fine reading. This signal distributor 8 is adopted for distributing the outputs of the odd-numbered photocells, 5-1, 5-3, ... 5-21, and the outputs of the even-numbered photocells, 5-2, 5-4, ... 5-22, of the line sensor 5 into two sequences of time serial signals. For this purpose, the distributor 8 need only comprise a simple gate circuit. Distribution into two sequences of time serial signals may be accomplished by receiving the clock pulses from the drive circuit 9 at a flip-flop, for example, and gating the input time serial signals by Q and $\bar{Q}$ outputs from the flip-flop which alternately become "1" and "0". The two sequences of signals distributed by the distributor 8 are supplied to envelope detectors 14 and 15, respectively, for detection of the envelopes. Consequently, the outputs of odd-numbered photocells, 5-1, 5-3, ... 5-21, are detected by the detector 14 to provide an envelope signal X as shown in FIG. 6(b). The outputs of the even-numbered photocells, 5-2, 5-4, ... 5-22, are detected by the detector 15 to provide an envelope signal Y as shown in FIG. 6(c). These signals X and Y are compared at a comparator 16 to determine their level difference. The comparator 16 includes, for example, a differential amplifier having the X signal supplied to its positive input terminal and the Y signal applied to its negative input terminal. Then, as shown in FIG. 6(d), a coincidence signal is output only at the intersection Z1 at which the polarity of the differential amplifier output changes from plus to minus and the levels of the signals are the same and the phase changes from the positive phase (X>Y) to the negative phase (X<Y). This coincidence signal is supplied to a counter 17. Then, the counter 17 outputs to the converting circuit 13 a count output signal of the clock pulses generated from the starting point of the scanning of the line sensor 5. The results of the coarse and fine readings thus obtained are corrected and converted into an actual displacement by the converting circuit 13, and the result is digitally displayed at a display device 18.

The method for correction will now be described. When the line sensor 5 and the code plate 1 are displaced relative to each other from the positions shown in FIG. 5, the first photocell 5-1 is assumed to be used for coarse reading. When the code plate 1 shown in FIG. 5 is displaced relative to the line sensor 5 in the direction shown by arrow, the first photocell 5-1 is coarsely counted for each boundary between the transparent and nontransparent parts, e.g., the boundary between the transparent part 1-1 and the nontransparent part 1-2 of the code plate 1, between 1-2 and 1-3, and so on.

Upon the displacement of the code plate 1 by the distance W in the direction of the arrow, the reading of the vernier changes from S=0 to S=22S0. During the time the reading of the vernier changes from S=0 to S=22S0, coarse reading becomes 0 within the range of 0 to W/4, and 1 within the range of W/4 to 3W/4. When the boundary between the transparent part 1-1 and the nontransparent part 1-2 passes that left end part of the photocell 5-1 shown in the figure, the reading changes from 0 to 1. However, since the displacement of the code plate 1 is W/4 in this case, an error of W/2 is included in the measurement unless the coarse reading is made 0. When the coarse reading is at the boundary between 0 and 1, the fine reading is about 6/22. Thus, the coarse reading is set to 0, irrespective of the coarse reading of 0 or 1. When the coarse reading is at the boundary between 1 and 2, the fine reading is about 17/22. Thus, the coarse reading is also set to 0. That is, when the coarse reading is an odd number, the incremented accumulated reading is decremented by 1. When the coarse reading is an even number and the fine reading is smaller than 11/22, the value may remain unchanged. When the coarse reading is an even number and the fine reading is larger than 11/22, the accumulated reading is decremented by 2. The results as obtained in this manner are shown in Table 1 below.

TABLE 1

| Coarse reading | 0 or 1 | 1 or 2 | 2 or 3 | 3 or 4 | 4 or 5 | 5 or 6 |
|---|---|---|---|---|---|---|
| Fine reading | 6/22 | 17/22 | 6/22 | 17/22 | 6/22 | 17/22 |
| Coarse reading after correction | 0 | 0 | 2 | 2 | 4 | 4 |

TABLE 1-continued

| Coarse reading | 0 or 1 | 1 or 2 | 2 or 3 | 3 or 4 | 4 or 5 | 5 or 6 |
|---|---|---|---|---|---|---|
| Fine reading | 6/22 | 17/22 | 6/22 | 17/22 | 6/22 | 17/22 |
| Displacement | 6/22 | 17/22 | $1\frac{6}{22}$ | $1\frac{17}{22}$ | $2\frac{6}{22}$ | $2\frac{17}{22}$ |

With an encoder of the construction shown in FIG. 4, vibrations, shrinkage and deformation of the code plate 1 and the line sensor 5 due to changes in temperature and changes in the magnifications of the lens 4 contribute to degradation in the measurement precision.

For example, when a position displacement detection system comprising the code plate 1 and the line sensor 5 are constructed as shown in FIG. 7A, the relative relationship of a pair of lenses 4a and 4b and the line sensor 5 along the optical path of the incident light is important. This relative relationship defines the vernier relationship between the code plate 1 and the line sensor 5. When any slight error in position is caused in this position displacement detection system due to changes in the ambient temperature, vibrations and so on, the vernier relationship set during design and manufacture is disturbed, resulting in reading errors.

Referring to FIG. 7B, the ordinate indicates the vernier base N and the abscissa indicates the rate of change (%) when the magnification of the pattern image of the code plate 1 projected on the sensor 5 has changed for the reasons described above from that of the initially set condition in which the vernier relationship is $WN=M(N+1)$ where $N=10$ and the pitch of the photocell on the line sensor is 10 μm. According to FIG. 7B, when the rate of change of the magnification changes by 1%, N changes by about 10%. Therefore, when reading is performed involving a scale position spaced apart from the origin of the interpolated scale, the error between the reading and the true value becomes greater.

In order to manufacture an encoder which will maintain high precision regardless of external conditions such as temperature changes, vibrations and so on, the manufacturing errors of various parts must be minimized. This presents a number of problems including lower manufacturing yield, higher manufacturing cost, requirement of precise adjustment during assembly, and so on.

SUMMARY OF THE INVENTION

The present invention has been made in consideration of the above and has for its object to provide an encoder which is capable of correcting the errors caused by changes in the external environment such as temperature changes, vibrations and so on and which is capable of measurement with high precision without requiring such strict limitations in manufacturing and assembly errors as have been heretofore required.

In order to achieve this object, the present invention provides an encoder wherein a fine reading including errors due to changes in the ambient in the ambient environment such as temperature changes, vibrations and so on is obtained; information including an error coefficient characterizing this error, for example, the magnification change of a lens system, is obtained; and the fine reading and the error coefficient information are supplied to a converting circuit to correct the error and provide the true value.

BRIEF DESCRIPTION OF THE DRAWING

This invention can be more fully understood from the following detailed description when taken in conjunction with the accompanying drawings, in which:

FIG. 2 shows the relationship between the optical measuring part shown in FIG. 1 and an output signal of the line sensor;

FIG. 4 is a block diagram showing an example of an encoder using the optical measuring part shown in FIG. 1;

FIG. 8 is a block digram showing an encoder according to an embodiment of the present invention;

FIG. 12 is a block diagram showing still another embodiment of the present invention;

FIG. 15 is a flow chart for explaining the mode of operation of the embodiment of FIG. 12.

DESCRIPTION OF THE PREFERRED EMBODIMENTS

Figure 7A:
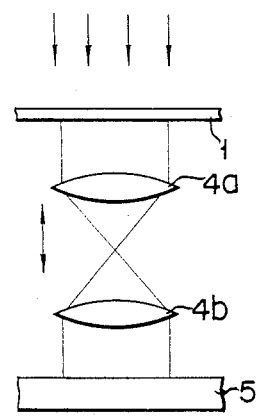
FIG. 7A is a schematic view of the optical measuring part for explaining the cause of error in the encoder shown in FIG. 4.
Figure 7B:
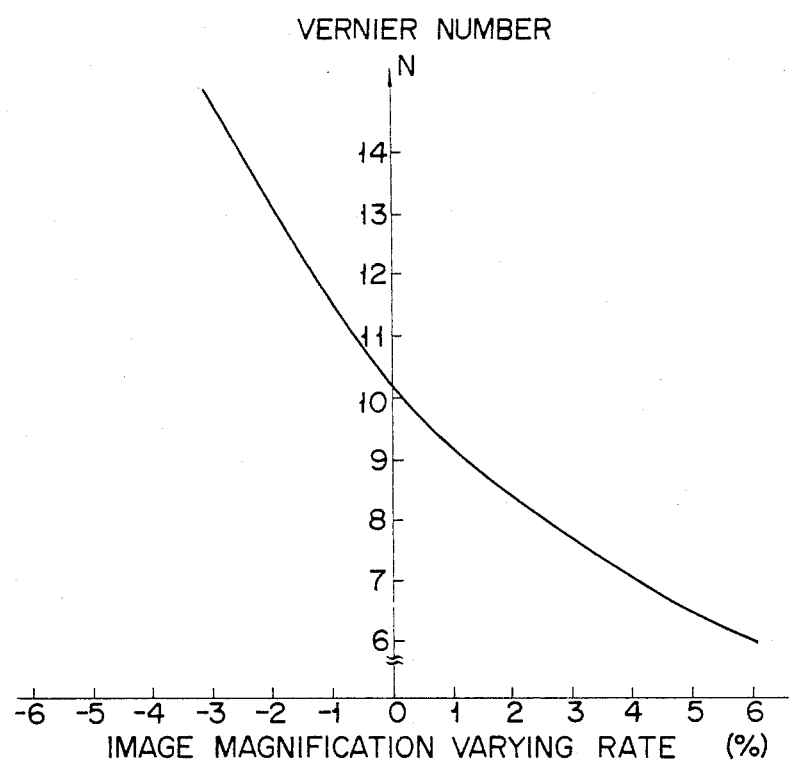
FIG. 7B is a graph showing the relationship between the vernier base N defining the vernier relationship between the code plate and line sensor shown in FIG. 4 and the rate of change of the magnification of the lens system of the optical measuring part shown in FIG. 7A.

Before describing the preferred embodiments of the present invention, the principle of the present invention will be described. Referring to FIG. 7A, the code plate 1 and the line sensor 5 are constructed as shown in FIG. 2 and have periods W and M, respectively. The pattern image of the code plate 1 is projected on the line sensor 5 through the system of lenses 4a and 4b. The period of the projected image of the code plate of period W on the line sensor is P. Further, as shown in FIG. 2, the period of the output waveform of the line snsor 5 is T. The inverse numbers 1/W, 1/M and 1/T of the respective periods W, M and T may be considered as the spatial frequencies of the code plate 1, the line sensor 5, and the output of the line sensor 5.

When two signals having frequencies f1 and f2, respectively, are mixed by a mixer, a signal having a frequency equal to the difference (f1−f2) of these frequencies is, in general, obtained. In a similar manner, the frequency 1/T of the output of the line sensor may be represented by the difference between the frequency 1/P of the projected image of the code plate 1 and the frequency 1/M of the line sensor 5 as follows $$1/T = 1/M - 1/P \quad (1)$$

Therefore, the period T of the output of the line sensor 5 may be written as $$T = \frac{MP}{P - M} = \frac{P}{\frac{P}{M} - 1} \quad (2)$$

If P/M=K, equation (2) may be rewritten as $$T = P/(K-1) \quad (3)$$

P may then be obtained from equation (1) as $$P = \frac{MT}{T - M} \quad (4)$$

Therefore, as may be apparent from equation (4), when the period T of the output of the line sensor 5 is detected, the projecting period P of the image on the line sensor 5 may be obtained since the period M of the line sensor 5 is constant. It is now assumed that, referring to FIG. 7A, by changing the distance between the code plate 1 and the line sensor 5, or by displacing the system of lenses 4a and 4b, the magnification for projecting the pattern period W of the code plate 1 on the line sensor 5 is changed. Thus, the projecting period P of the image on the line sensor 5 as obtained from equation (4) includes the change component of the projecting magnification which causes the measurement error. This change component corresponds to the change in the projecting magnification which causes the error in the fine reading obtained according to the vernier relationship between the code plate 1 and the line sensor 5. Accordingly, it is apparent that the error caused by the disturbance of the interpolated scale according to the vernier may be corrected utilizing this relationship.

Figure 6:
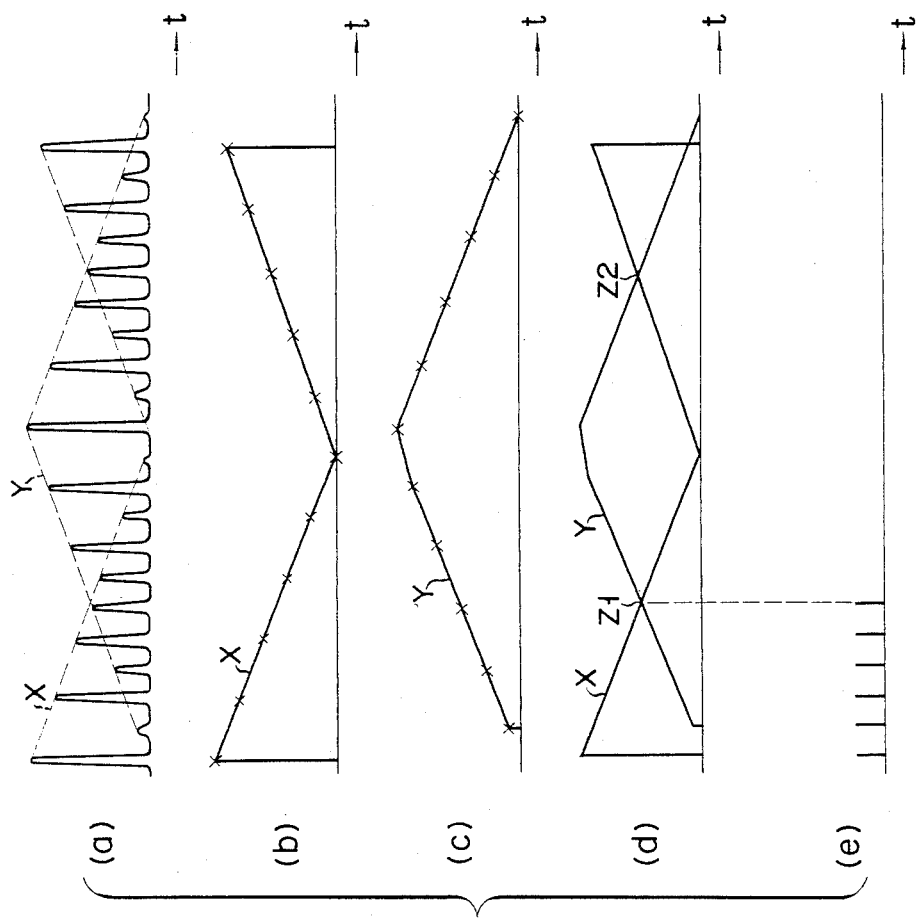
FIG. 6 shows signal waveforms for explaining the mode of operation of the encoder shown in FIG. 4.

For detecting the period T of the output waveform of the line sensor 5, the clock pulses synchronous with the outputs of the line sensor 5 and generated between the intersection Z1 and the next intersection Z2 of the envelopes X and Y of the outputs of the photocells of odd and even number of the line sensor 5 are counted. As a result, the half period T/2 of the output waveform of the line sensor may be detected (FIG. 6).

Alternatively, the period T may be directly obtained by counting the clock pulses generated between the intersection Z1, at which the phase changes from the positive phase (X>Y) to the negative phase (X<Y), to the next intersection (not shown) at which the phase changes from positive to negative.

Figure 1:
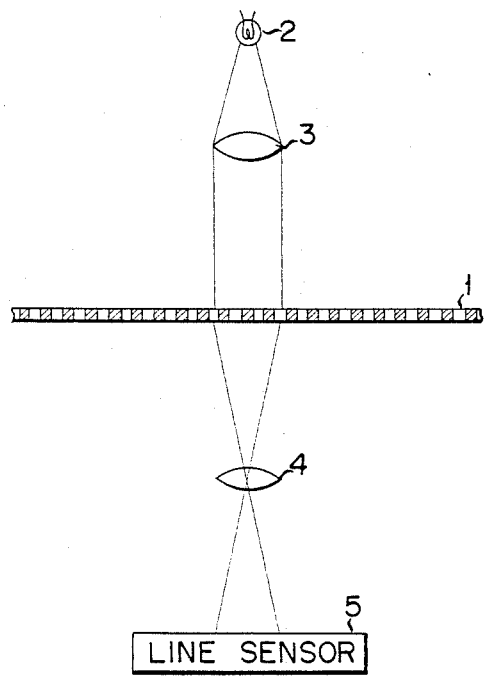
FIG. 1 shows the construction of the optical measuring part of an encoder using a code plate and a line sensor.
Figure 5:
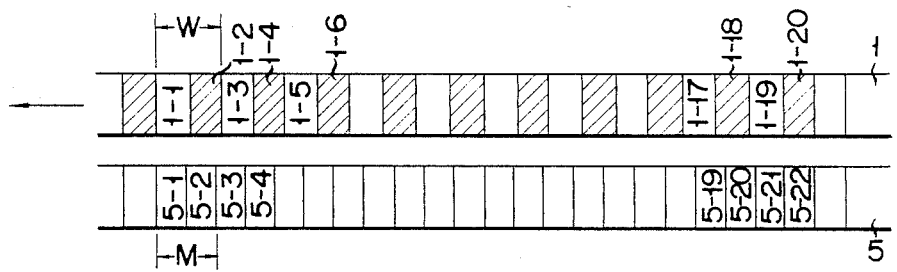
FIG. 5 shows instantaneous relative positions of the code plate and the line sensor shown in FIG. 4.

This will be considered with actual values. It is assumed that the pitch of the line sensor 5 shown in FIG. 5, that is, the distance between the center of one photocell to that of an adjacent photocell or the width of one photocell, is 10 μm. Then, the period M of the line sensors 5 is two pitches, i.e., 20 μm. When the count of the clock pulses synchronous with the detected sensor outputs of period T is 22, the period T is obtained as $$T = 10\mu \times 22 = 220\mu$$

Therefore, the projecting period P may be obtained from equation (5) as $$P = \frac{MT}{T - M} = \frac{20 \times 220}{220 - 20} = 22 \ (\mu m)$$

Since the value of T/P is 10, this indicates that the base N of the vernier relationship N:N+1 between the code plate 1 and the line sensor 5 is 10. Thus, one calibration unit of the interpolated scale for providing the fine reading at this time is $$S0 = P/2(N+1) = 22/2(10+1) = 1 \ (\mu m)$$

For example, it is assumed that the count of the clock pulses generated from a particular photocell of the line sensor 5 to the intersection Z1 of the two envelopes X and Y detected by the method described above is 12. The relative displacement S of the code plate 1 and the line sensor 5 at this time is expressed as S=6S0. This indicates that the relative displacement of the code plate 1 and the line sensor 5 is 6 μm from the particular selected photocell.

It is next assumed that the above vernier relationship is disturbed for some reason, where the period T of the sensor output waveform of the line sensor 5 corresponds to 240 μm. The projecting period P may be obtained from equation (4) as $$P = \frac{20 \times 240}{240 - 20} \approx 21.82 \ (\mu m)$$

Since T/P=10.999≈11, the base N of the vernier relation N:N+1 becomes 11.

One calibration unit S0 of the interpolated scale for providing the fine reading may be obtained as $S0 = P/2(N+1) = 21.82/2(11+1) = 0.9$ μm. When the count of the clock pulses up to the intersection Z1 is 12, the fine reading S may be obtained as $$S = 6S0 = 6 \times 0.91 \ \mu m = 5.46 \ \mu m$$

When the period T of the output waveform of the line sensor 5 is not detected and the interpolated scale is not corrected, a large error may result from the disturbance of the vernier relationship by an external factor even if N is set to 10 and the period M of the line sensor 5 is set to 20 μm at the initial setting. Referring to the case described above, when the correction of the vernier scale is not performed, the actual displacement 5.46 μm is read as 6.00 μm.

In the above description, the clock pulses used for detection of the envelopes X and Y and the period T of the line sensor output are synchronized with the outputs of the line sensor 5. Thus, the pulses for driving and scanning the line sensor 5 are also counted. The period of the clock pulses for scanning the line sensor 5 is several times larger than the period of the clock pulses to be counted for improving the detection of the intersections and the precision of the correction of the error due to the disturbance. The detection resolution may be improved by this method. The detection precision may further be improved by not stopping the measurement with the output period for one block but continuing the measurement for several periods and obtaining the mean value.

The preferred embodiments of the present invention constructed according to the principle described above will now be described. FIG. 8 shows an encoder for detecting the table position of an NC machine designed, for example, for linear displacement. The same reference numerals denote the same parts as in FIG. 4 and their description will be omitted. Referring to FIG. 8, the code plate 1 and the line sensor 5 are set to periods W and M as in the case of FIG. 2. The signal generating circuit 9 shown in FIG. 4 is modified in the embodiment shown in FIG. 8 such that the output pulses of a pulse generator 9a are input to a 1/1 frequency divider 9b. The output of the 1/1 frequency divider 9b is supplied to a clock pulse input terminal of the line sensor 5 through a driving circuit 9c. The driving circuit 9c outputs a starting pulse SP at the starting point of the scanning of the line sensor 5. In response to respective input clock pulses, the line sensor 5 sequentially scans and outputs time serial signals as shown in FIG. 6(a) to the amplifier 6. The clock pulses supplied to the line sensor 5 are also supplied to an m-base counter 9d. This counter 9d functions to sample the output of the mth photocell alone of one block of the line sensor 5 and to supply a sampling signal to the sampling and holding circuit 7 when the mth photocell from the starting point of the scanning of the line sensor 5 is being scanned. The output pulses of the pulse generator 9a are also supplied to the clock input terminal of the counter 17 and to one input terminal of an AND gate 21. The counter 17 and the line sensor 5 simultaneously receive the start pulse SP output from the driving circuit 9c, and the counter 17 starts counting the pulses supplied by the pulse generator 9a. The output of the comparator 16 is supplied to a stop terminal of the counter 17 and to an input terminal of a flip-flop 22. In response to the starting pulse SP from the driving circuit 9c, the flip-flop 22 is rendered operative and is switched alternately between the set and reset conditions each time a signal is received from the comparator 16. The set output of the flip-flop 22 is suppied as a gate opening signal to the other input terminal of the AND gate 21. The output pulse of the AND gate 21 is supplied to a counter 23 whose count is supplied, together with the count of the counter 17, as address signals to a ROM 13a functioning as a converting circuit.

The mode of operation of the embodiment shown in FIG. 8 will now be described. The coarse reading is represented by the output of the counter 12 in a similar manner to that of the encoder shown in FIG. 4. The relative displacement of the line sensor 5 and the code plate 1 with the half width W/2 of the lattice pattern of the code plate 1 as the minimum unit is supplied to an adder 24.

The fine reading obtained according to the vernier formed by the code plate 1 and the line sensor 5 is also provided by the count of the counter 17 in a manner similar to that of the encoder shown in FIG. 4. In the counter 17, the output counted from the time the starting pulse SP is output to the time the intersection Z1 at which the phase of the envelopes X and Y changes from positive to negative is detected as the information which includes the error due to the change in the projecting magnification of the code plate 1 on the line sensor 5. This information is used as column address information in the ROM 13a.

The flip-flop 22 is set by the detection output of the first intersection Z1 from the comparator 16 from the time the starting pulse SP is output. This set output opens the AND gate 21, and the clock pulses from the pulse generator 9a begins to be counted by the counter 23. The flip-flop 22 is reset by the signal output from the comparator 16 corresponding to the next intersection Z2 of the envelopes X and Y, that is, the intersection at whicn the phase changes from positive to negative. Then, the flip-flop 22 closes the gate 21 and stops the counting operation of the counter 23. Consequently, the count of the counter 23 represents one period T of the output waveform of the line sensor 5 as shown in FIG. 2(c). This output includes the output corresponding to the change in the projecting magnification of the code plate 1 on the line sensor 5, that is, the information representing the change component of the projecting magnification. The output of the counter 23 is used as row address information in the ROM 13a.

When the table written in the ROM 13a is set in advance such that the true values corrected for the error component due to the change in the projecting magnification may be read according to the row and column address information, the true values which are not affected by the change in the magnification may be read out as the fine reading from the ROM 13a. The information read out from the ROM 13a is supplied to the adder 24 where the correction as described above is performed. The output is further converted into an actual displacement by a multiplier 25 and is digitally displayed at the display device 18.

The converting circuit may comprise a microprocessor instead of the ROM 13a. When a microprocessor is used, the correction of the error caused by the change in the projecting magnification may be performed as follows:

(1) The output of the counter 23 is read to provide a period T of the output waveform of the line sensor 5 when the projecting magnification has changed.

(2) The reference set value of the period T when the projecting magnification is 1 is compared with the actual read value to provide a rate of change of the magnification with respect to the reference set value.

(3) By multiplying the rate of change of the magnification obtained in item (2) above with the fine reading obtained from the counter 17 according to the vernier from the starting position to the intersection Z1 of the envelopes X and Y, the reading can be converted into a fine reading when the projecting magnification is 1.

Figure 3A:
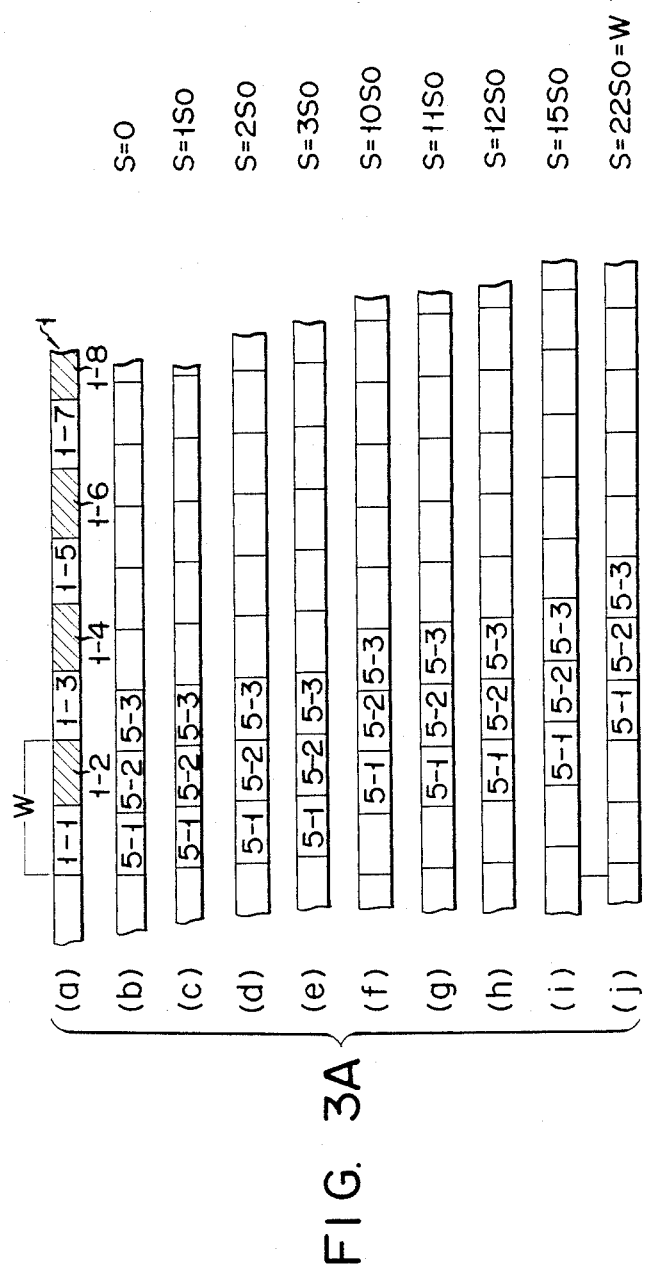
FIG. 3A shows the relative positions of the code plate and the line sensor.
Figure 3B:
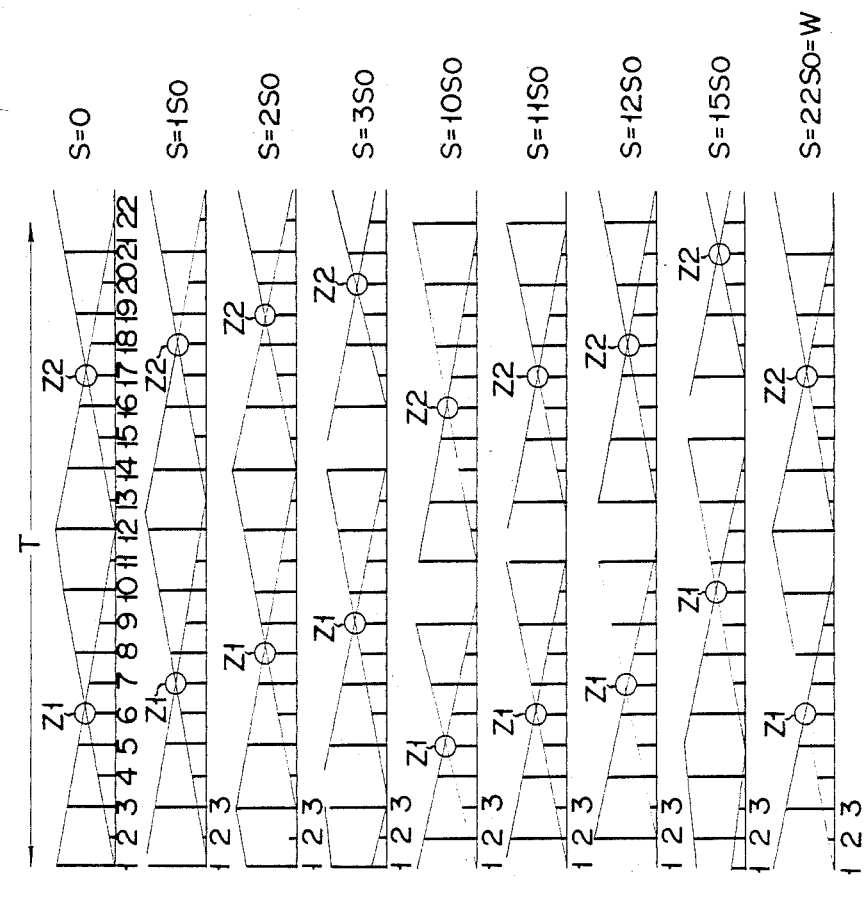
FIG. 3B shows signal waveforms for explaining the change in the output waveform of the line sensor at each relative position of FIG. 3A.
Figure 9:
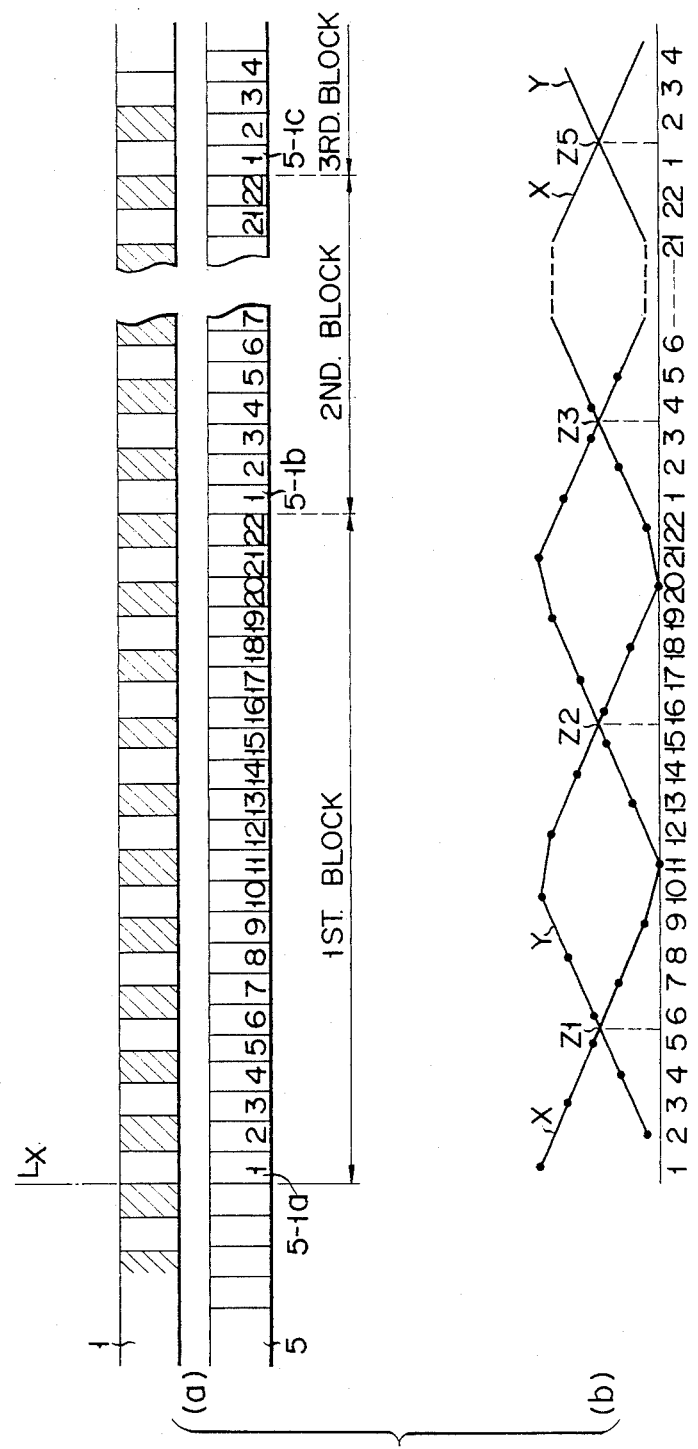
FIG. 9 shows the relationship between the relative positions of the code plate and the line sensor shown in FIG. 8 at a given moment and the output signal obtained at the line sensor at this moment.

Although the above description has been made with reference to the measurement of the displacement by the reading of only one block, it is preferable to measure over several blocks for increasing the reliability of measurement. A case will now be described with reference to FIG. 9 wherein M=20 μm, W=22 μm, and the reading is performed for three blocks. Referring to FIG. 9(a), photocells 5-1a, 5-1b and 5-1c at the initial positions of each block are used as the photocells for coarse reading; they are spaced apart from each other by the period T when the magnification is 1. When the magnification increases by 1%, the projecting period is $P=22\times 1.01=22.22$ (μm), and the period of the line sensor output waveform $T=P\cdot M/(P-M)=200.18$ μm which is about 0.9 times the period 220 μm when the magnification is 1. On the other hand, as shown in FIG. 9(b), the intersection Z1 at which the phase changes from positive $(X>Y)$ to negative $(X<Y)$ is between the fifth and sixth photocells i.e., 5.5. and this is defined as the starting point. (The intersection Z1 at which the phase changes from positive to negative when the magnification is 1 is 6 as shown in FIG. 3). In the second and third blocks, the intersection is shifted toward the left due to the shortening of the period which results from the increase in the magnification. The starting point is 3.5 at the intersection Z3 and is 1.5 at the intersection Z5. The conversion table obtained in this manner is as shown in Table 2. This conversion table is written in a ROM similar to the ROM 13a shown in FIG. 8. The converting circuit obtains the fine reading by converting for each block and provides the displacement by performing the correction as shown in Table 1 and obtaining the mean value of the respective blocks. Although the conversion is performed with the ROM in this embodiment, the conversion table includes values which may be obtained by calculation so that it may be performed by calculation without incorporating the ROM.

It is to be noted with reference to Table 2 that the table corresponding to each block corresponds to the magnification and the distance from optical axis LX.

TABLE 2

| | Vernier intersection when magnification is 1 | Factor 1.01 | | |
|---|---|---|---|---|
| Displacement | | Intersection of first block | Intersection of second block | Intersection of third block |
| 0/22 | 6 | 5.5 | 3.5 | 1.5 |
| 1/22 | 7 | 6.4 | 4.4 | 2.4 |
| 2/22 | 8 | 7.3 | 5.3 | 3.3 |
| 3/22 | 9 | 8.2 | 6.2 | 4.2 |
| 4/22 | 10 | 9.1 | 7.2 | 5.1 |
| 5/22 | 11 | 10.0 | 8.1 | 6.0 |
| 6/22 | 12 | 11.0 | 8.0 | 6.9 |
| 7/22 | 13 | 11.9 | 9.9 | 7.8 |
| 8/22 | 14 | 12.8 | 10.8 | 8.8 |
| 9/22 | 15 | 13.7 | 11.7 | 9.7 |
| 10/22 | 16 | 14.6 | 12.6 | 10.6 |
| 11/22 | 17 | 15.5 | 13.5 | 11.5 |
| 12/22 | 18 | 16.4 | 14.4 | 12.4 |
| 13/22 | 19 | 17.3 | 15.3 | 13.3 |
| 14/22 | 20 | 18.2 | 16.3 | 14.2 |
| 15/22 | 21 | 19.1 | 17.2 | 15.1 |
| 16/22 | 22 | 20.1 | 18.1 | 16.0 |
| 17/22 | 1 | 1.0 | −1.0 | −3.0 |
| 18/22 | 2 | 1.9 | −0.1 | −2.1 |
| 19/22 | 3 | 2.8 | 0.8 | −1.2 |
| 20/22 | 4 | 3.7 | 1.7 | −0.3 |
| 21/22 | 5 | 4.6 | 2.6 | 0.6 |

According to the embodiment of the construction as described above, the error caused by changes in the ambient environment or the like may be corrected so that precise measurements may be constantly obtained. Furthermore, since the correct adjustment of the relative positions of the code plate, the lens and the line sensor is not as critical as in the prior art system, assembly and handling are much easier.

Figure 10:
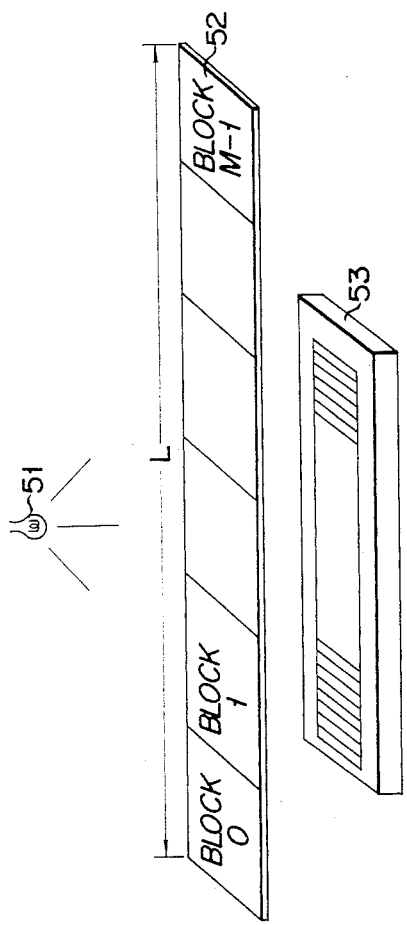
FIG. 10 is a schematic perspective view of the optical measuring part of another embodiment of the present invention.
Figure 11:
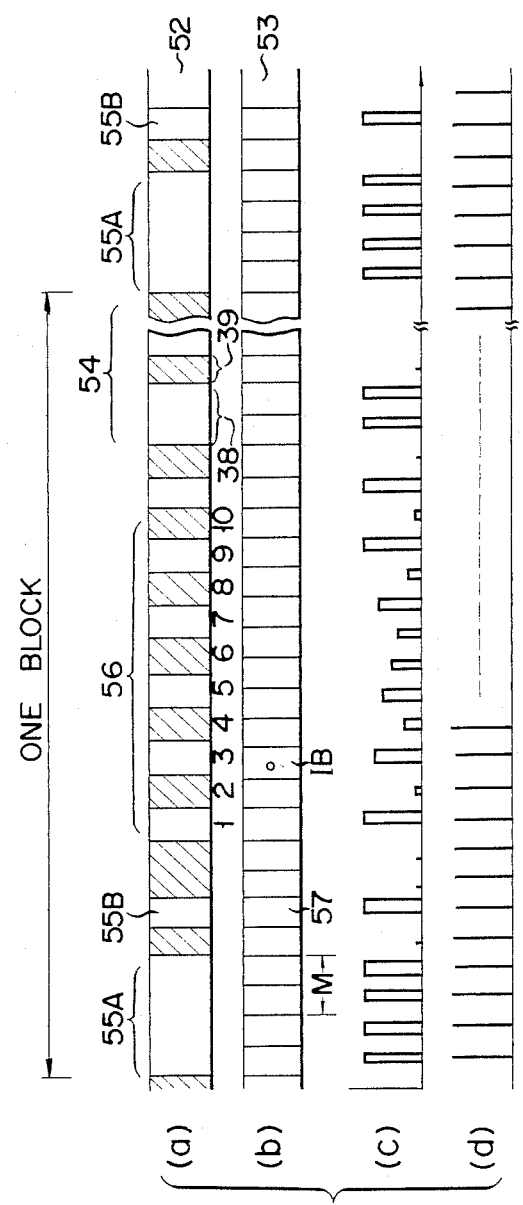
FIG. 11 shows the relationships among an example of the relative positions of the code plate and the line sensor shown in FIG. 10, the line sensor output and the clock pulses in this example.

As another embodiment of the present invention, magnification correction of an encoder for reading absolute position will be described. This encoder, as shown in FIG. 10, has a light source 51, a code plate 52, and a line sensor 53. The code plate 52 of overall legnth L is divided into M blocks each of which consists of, as shown in FIG. 11(a), a pattern 54 representing the address information of the block, a start position pattern 55B representing the starting position of the block following a characteristic pattern 55A, and a code pattern 56 (vernier information) for interpolaring the minimum calibration unit. The light source 51 is arranged in opposition to the code plate 52 at the opposite side of which is arranged the line sensor 53 which has a length that will allow the projection of one block of the code plate 52. FIG. 11(a) shows one block of the code plate 52, FIG. 11(b) shows the corresponding line sensor 53 in an enlarged scale, FIG. 11(c) shows the output of the line sensor 5 in this instance, and FIG. 11(d) shows the clock pulses synchronous with the outputs of the line sensor.

The reading of the absolute position when the correction of the magnification is not performed is as follows. When the bit of the output of an arbitrary photocell of the line sensor 53 is defined as index bit IB, each block may be divided into units of half the period M/2 of the line sensor 53 by counting the clock pulses generated from the time of detection of the photocell on the line sensor 53 on which is projected the block starting position pattern 55B following a particular characteristic pattern 55A of the code plate 52, that is, the bit 57 (to be referred to as a start bit hereinafter) to the time of detection of the index bit. Furthermore, it is possible to read the address information of a block whose position from the start bit is known. Thus, the period M of the line sensor 53 may be interpolated in $\tfrac{1}{2}N$ in exactly the same manner as the fine reading from the vernier scale described above.

The absolute position may be read by totaling the block address, the interpolation within the block in units of M/2, and the interpolation of the line sensor period. It is to be understood that detection in a unit less than M/2, half the period of the line sensor 53, is possible by performing the detection of the start bit with good precision and using clock pulses counted from the start bit to the index bit, these clock pulses being of a frequency correspondingly larger than that of the clock pulses synchronous with the outputs of the line sensor.

FIG. 12 shows an embodiment wherein the present invention is applied to a linear encoder for reading the absolute position of the displacement table of a machine tool or the like.

The code plate 52 as described above is secured to part of a displacement table 61. The line sensor 53 is arranged parallel to the table 61. The light emitted from the light source 51 becomes incident on the code plate 52 through a collimator lens 511. The light transmitted through the code plate 52 has an intensity distribution corresponding to the particular pattern on the code plate 52 and is projected on the line sensor 53. When the overall length of the line sensor 53 is suitably selected, the serial output signal of the line sensor 53 includes the address information, the block start position information, and the vernier information of the block of the code plate 52. An arbitrary bit of the line sensor 53 is determined as the index bit in advance. An output 63 of the line sensor 53 is amplified by an amplifier 62 to a suitable level, and the start bit is detected by a start bit detector 64. Upon detection of the start bit, the start bit detector 64 simultaneously opens an AND gate 65 and sets a flip-flop 66. The flip-flop 66 remains set and keeps an AND gate 68 open until an index detector 67 detects the index bit. The AND gate 68 also sends clock signals output by a clock generating circuit 70 synchronous with the outputs of the line sensor to a binary counter 69 until the index detector 67 detects the index bit. Thus, the binary counter 69 counts the number of pulses from the start bit to the index bit. That is, the value is obtained from the counter 69 which represents the index bit obtained by dividing one block of the code plate 52 by an interval equal to the half period M/2 of the line sensor 53. This value will be referred to as data (A). The gate 65 opened by the start bit detector 64 supplies clock pulses to an M-base counter 71 and an N-base counter 72. The N-base counter 72 turns on an analog switch 73 at the Nth pulse after the start bit is detected and supplies to an A/D converter 74 the vernier scale information output from the amplifier 62. The A/D converter 74 A/D converts the outputs of the respective blocks of the line sensor 5 constituting the vernier scale information and temporarily writes them in a data register 75. This will be referred to as data (B). Similarly, the M-base counter 71 turns on an analog switch 76 at the Mth pulse, receives from the amplifier 62 the outputs of the blocks serially coded from the Mth pulse from the start bit, and sends them as address information to a comparator 77. The signal is quantized at a suitable threshold level at the comparator 77 and information of parallel binary number is generated at a serial-parallel converter 78. This will be referred to as data (C).

Accordingly, the data (A), (B) and (C) constituting the position information are generated from the time serial data output upon one scanning operation of the line sensor, and they are received in a microprocessor 79. The microprocessor 79 linearly (or curvilinearly) approximates the odd-numbered element output and the even-numbered element output from the output (B) of the A/D converter 74 as the vernier information and obtains the intersection at which the phase changes from positive to negative among the intersections of the two lines corresponding to the envelopes X and Y. The fine reading obtained from this intersection and the coarse reading obtained with data (A) are corrected. Furthermore, using the data (C), the information is converted into the position information and is displayed at a display 80.

Figure 13:
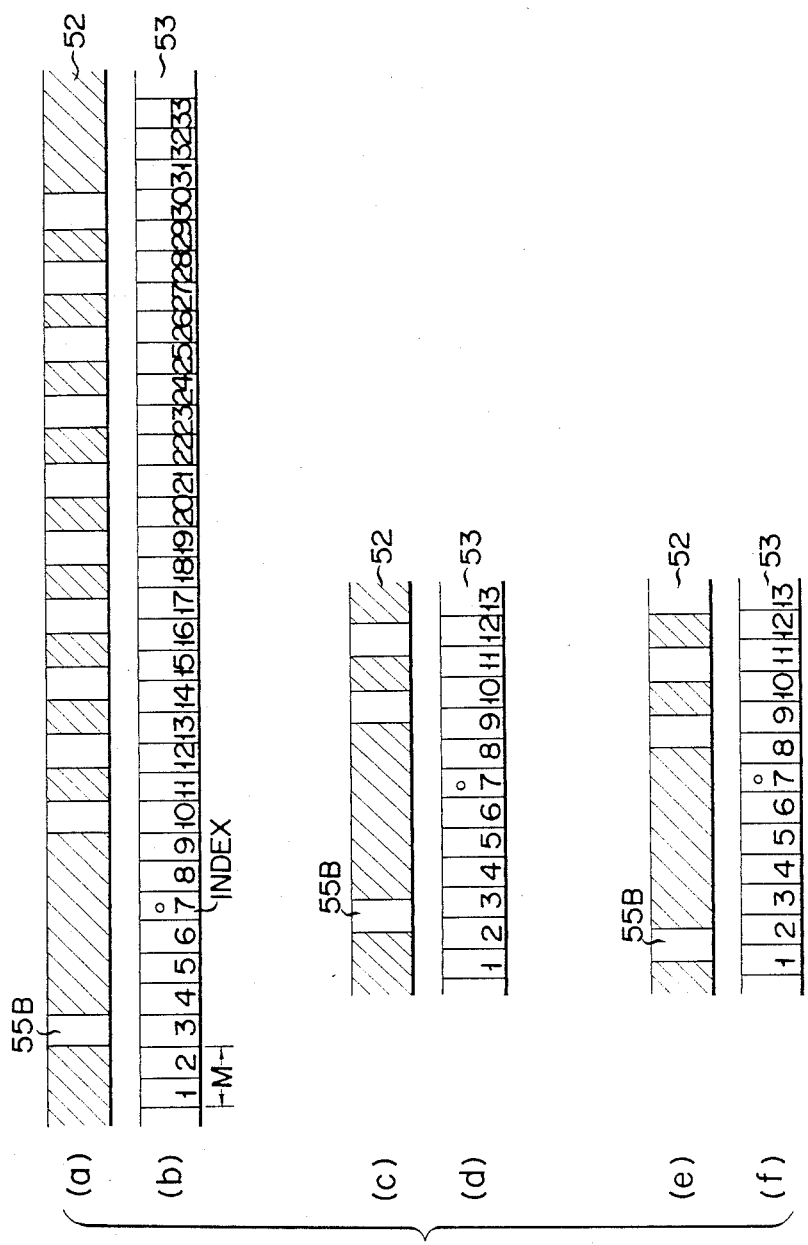
FIG. 13 shows different relative positions of the code plate and the line sensor of the encoder shown in FIG. 12.

The method for correction will now be described. It is assumed that the numbers of the respective elements of the line sensor 53 are determined as shown in FIGS. 13(a) and 13(b) and the vernier information starts from the right side of the start mark 55B, that is, from the seventh bit in the sensor element length of the code plate 52. When the index bit of the line sensor 53 is the element 7, the start mark 55B is detected at the sensor element 3 and the coarse reading in units of M/2 up to the index bit becomes 4. If it is determined that the vernier information starts from an even-numbered element, it starts from the tenth element 10 since $3+7=10$. The intersection Z1 where the phase changes from positive to negative becomes the element 15 in this case. The intersection position shown in FIG. 3 corresponds to the sixth element of the sensor and the reading is 0/22. The intersection Z1 corresponding to FIG. 3 is determined by the calculation $15-(10-1)=6$. When the correction is performed here, $(4/2)+(0/22)$ is obtained in a similar manner to that described with reference to the incremental reading.

It is now assumed that the code plate 52 has been displaced to the left near where the count of the coarse reading changes as shown in FIGS. 13(c) and 13(d).

When the start mark 55B is detected by the element 3, the coarse reading is 4 and the fine reading is 6/22 as has been described above, and the readings may be corrected as $(4/2)+(6/22)$. When the start mark 55B is detected by the element 2, the coarse reading is 5 and the vernier information is $2+7=9$. Since it is determined that the vernier information starts from the even-numbered element, it starts from the element 10 and the fine reading is 6/22. When the correction is performed, since 1 is subtracted from the coarse reading since the coarse reading is an odd number, the corrected reading becomes $(4/2)+(6/22)$. It is now assumed that the code plate 52 has been further displaced as shown in FIGS. 13(e) and 13(f). When the start mark 55B is detected by the element 2, the coarse reading is 5 and the fine reading is 17/22. The correction gives $(4/2)+(17/22)$. When the start mark 55B is detected by the element 1, the coarse reading is 6 and the fine reading is 17/22. Thus, $(4/2)+(17/22)$ is obtained after the correction.

The correction may thus be performed in the absolute position reading in a manner similar to the incremental reading. Although the odd- or even-numbered starting element of the index element and vernier information defined above may be determined argitrarily, some correction may be required in certain cases.

The magnification correction when the projecting magnification of the projecting optical system of the code pattern has changed will be described with reference to another embodiment of the present invention. In the interpolation method of the vernier system, the change in the magnification of the projecting system of the code pattern appears amplified in the output waveform of the line sensor (vernier waveform) as has already been described. The correction for compensating for this change component of the magnification has been already described. However, a new problem to be described below arises with the method for measuring the absolute position between the code pattern and the line sensor.

Figure 14:
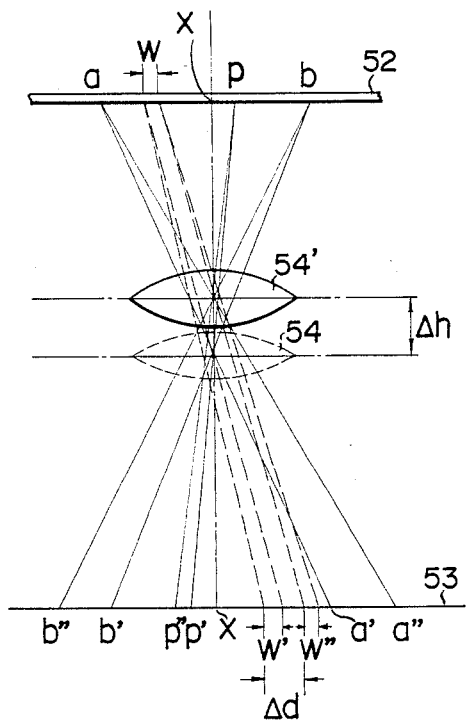
FIG. 14 is a view for explaining the mechanism according to which errors are generated by the displacement of the lens system of the optical measuring part used in FIG. 13.

Referring to FIG. 14, it is now assumed that the image corresponding to the code plate 52 is projected by a projecting lens 54 on the line sensor 53 in a 1:1 ratio. Then, point a is projected as point a', point b is projected as point b', and point p of the code plate 52 is projected as point p'. However, when the projecting lens 54 is slightly displaced upwardly a distance Δh to the position as shown by 54' and the projecting magnification changes from 1:1, the points on the line sensor 53 corresponding to the points a, b and c become the points a", b" and c". In this case, although the point b of the code plate 52 is projected at the position of the point b" on the line sensor 53 due to the change in the projecting magnification, it is projected on the line sensor 53 as deviated from the projected position corresponding to the magnification 1 by a distance b"−b'. The point p is also projected as deviated by p"−p'. However, the point X on the optical axis will show no deviation. Thus, it is seen that the deviation of the projecting positions due to the change in the magnification is proportional to the distance from the optical axis. When the projecting magnification is changed as shown in the figure, a given period W of the code plate 52 is also projected on the line sensor 53 as deviated by a distance W'−W", resulting in disturbance of the vernier relationship between the code plate 52 and the line sensor 53.

It is, therefore, necessary to correct for both the change in the projecting pitch and the deviation in the projected position due to the change in the magnification in a system for reading the absolute position as described above. The correction of the change in the projecting pitch and the detection of the change in the projecting magnification may be performed as has already been described with reference to FIG. 8.

The correction of the magnification may be easily accomplished by preparing in a ROM or the like a table incorporating as variables the rate of change of the magnification and the distance from the optical axis to the line sensor on which the vernier is projected. FIG. 15 shows a flow chart for the correction of the magnification in this case.

Figure 16:
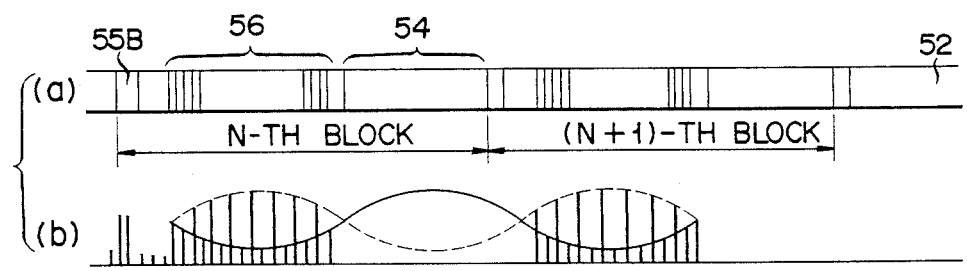
FIG. 16 is a view showing the relationship between the construction of the code plate and the line sensor output used in the embodiment of FIG. 12.

For improving the detection precision of the change in magnification, it is effective to obtain line sensor outputs over several periods. The mean value of the line sensor outputs over several periods may be easily obtained by superposing the phases of the vernier patterns within the respective blocks of the line sensor. FIGS. 16(a) and 16(b) show the relationship between the code pattern and the line sensor output waveform in this case. When a code pattern in which the vernier patterns of the respective blocks coincide is designed, the period of the vernier output waveform over several periods may be detected by obtaining the position of the intersection of the vernier waveform of a given block and the intersection of the vernier waveform of the block several blocks away, thereby improving the detection precision of the change in magnification.

Correct display may thus be attained by detection of the change in magnification using an encoder for reading the absolute position.

The present invention is in no way limited to the particular embodiments described above, and various changes and modifications may be made without departing from the spirit and scope of the present invention.

For example, referring to FIG. 11(a), the start mark 55B for representing the start position of the block need not be incorporated; instead, the last bit of the pattern 54 representing the address information may be used as the start bit. The code plate 52 may thus be made simpler. Although the above description has been made with reference to a linear scale of an optical encoder, it is to be understood that the present invention is applicable to a rotary encoder which has a circular scale. The same applies to a magnetic encoder which uses a magnetic lattice in place of the code plate and a magnetic-sensitive array as the sensor.

When the magnification changes, the ratio 1:1 no longer holds between the length of the block of the pattern on the code plate and the index bit interval so that the signal processing becomes complex. Therefore, it is preferable to incorporate dead zones between the blocks for compensating for the expected change in the magnification.

In summary, an encoder is provided according to the present invention, which is capable of correcting errors attributable to changes in the ambient environment and which is also capable of improving measuring precision.

What is claimed as new and desired to be secured by Letters Patent of the United States is:

1. An apparatus for correcting the vernier relationship between a code plate and a sensor array of an encoder, comprising:
   a sensor array in which a plurality of sensor elements are periodically arranged;
   a code plate which has a periodic lattice pattern having lattice pattern information of "1" and "0" alternately;
   projection means for projecting an image of the lattice pattern arrangement of said code plate onto said sensor array in unitary projected period of said code plate differing from a period of said sensor array;
   means for extracting a period of a time serial output signal which has periodicity, and which comprises a first detection means for detecting an envelope of the output of even numbered sensor elements of said sensor array, a second detection means for detecting an envelope of the output of odd numbered sensor elements of said sensor array, and calculating means for calculating the interval between the intersecting point of the envelopes detected by said first and second detection means by pulse signals generated from an oscillator;
   means for obtaining a unitary projected period from said output signal period and said unitary period of said sensor array; and
   correction means for correcting the vernier relationship of said code plate and said sensor array based on the amount of variation between the obtained projected period and a predetermined reference projected period.

2. A method of correcting a vernier relationship between a code plate and a sensor array of an encoder, said code plate defining a periodic lattice pattern having lattice pattern information "1" and "0" and said sensor array including a plurality of sensor elements which are periodically arranged, comprising the step of:
   producing a vernier relationship between said code plate and said sensor array by projecting an image of said code plate onto a sensor array in which a plurality of sensor elements are periodically arranged, said image of said code plate having a projection period differing from a sensor element array period of said sensor array;
   sensor read-out scanning said sensor array so that a time serial output signal which is possessed of periodicity is obtained from said sensor array and determining the period of an output signal thereof;
   determining said projection period P by $P=(T \cdot M/T-M)$ wherein T is the period of said output signal and M is a unitary period of said sensor array; and
   correcting the vernier relationship of said sensor array and said code plate based on the amount of variation between the determined projection period P and a predetermined reference projection period $P_0$.

3. The method of correcting according to claim 2, wherein said period T is applied as an average value of a plurality of periods of the output signal from the sensor array.

4. An apparatus for correcting the vernier relationship between a code plate and a sensor array of an encoder, comprising:
   a sensor array in which a plurality of sensor elements are periodically arranged;
   a code plate which has a periodic lattice pattern having lattice pattern information "1" and "0" alternately;
   projection means for projecting an image of the lattice pattern arrangement of said code plate onto said sensor array in a unitary projection period P of said code plate differing from a unitary period of said sensor array;

means for extracting a period of a time serial output signal obtained from a scan of said sensor array, said time serial output signal having a period T;

means for obtaining said unitary projection period P from said output signal period T and a unitary period M of said sensor array, wherein $P=(T \cdot M)/(T-M)$;

correction means for correcting the vernier relationship of said code plate and said sensor array based on the amount of variation between the obtained projection period and a predetermined reference projection period.

5. The correction apparatus according to claim 4, wherein said means for obtaining the period of said output signal comprises:

averaging means for determining an average value of a plurality of periods of the output signal.

* * * * *